United States Patent [19]

Bryce et al.

[11] Patent Number: 5,037,308
[45] Date of Patent: Aug. 6, 1991

[54] PROGRAMMABLE INTEGRATED INPUT/OUTPUT CONNECTOR MODULE AND SPRING CLIP CONNECTOR MECHANISM

[75] Inventors: James R. Bryce, Fairport; Timothy M. Minerd, Pittsford, both of N.Y.

[73] Assignee: Xerox Corporation, Stamford, Conn.

[21] Appl. No.: 560,811

[22] Filed: Jul. 31, 1990

[51] Int. Cl.⁵ .................. H01R 9/07; H01R 13/66
[52] U.S. Cl. .......................... 439/52; 439/68; 439/505; 439/516
[58] Field of Search ............... 439/43, 49, 52, 68–73, 439/525, 526, 189, 502, 505, 516

[56] References Cited

U.S. PATENT DOCUMENTS

| | | |
|---|---|---|
| 3,393,396 | 5/1966 | Majewski . |
| 3,573,617 | 4/1971 | Randolph et al. ............... 439/70 |
| 3,771,109 | 11/1973 | Bruckner et al. . |
| 4,084,869 | 4/1978 | Yen ............................... 439/651 |
| 4,089,041 | 5/1978 | Lockard ......................... 361/403 |
| 4,155,612 | 5/1979 | Silverio ........................... 439/52 |
| 4,330,163 | 5/1982 | Aikens et al. . |
| 4,358,175 | 11/1982 | Reid ............................... 439/331 |
| 4,376,560 | 3/1983 | Olsson et al. . |
| 4,471,158 | 9/1984 | Roberts ........................... 361/404 |
| 4,508,399 | 4/1985 | Dowling et al. .................. 439/71 |
| 4,557,540 | 12/1985 | Forbes et al. . |
| 4,609,241 | 9/1986 | Peterson ......................... 439/516 |
| 4,616,895 | 10/1986 | Yoshizaki et al. . |
| 4,701,134 | 10/1987 | Jones ............................. 439/43 |
| 4,761,140 | 8/1988 | Geib ............................... 439/71 |
| 4,870,224 | 9/1989 | Smith et al. ..................... 29/827 |

Primary Examiner—Neil Abrams
Attorney, Agent, or Firm—Oliff & Berridge

[57] ABSTRACT

A programmable integrated input/output connector module has a molded plastic base through which five bus wires extend. The molded base is equipped with channeled grooves into which five spring clips are housed and which make contact with a corresponding bus wire at the bottom of the molded base. One of the bus wires is a grounded bus wire to which a programmable packet is connected. A chip carrier having conductive traces is placed atop the spring clips so as to place the clips in compression while placing each conductive trace of the chip carrier in electrical contact with a corresponding one of the bus wires. An IC chip is fitted atop and electrically connected to the chip carrier. The programmable packet has six fingers which can be bent away from or left in contact with the chip carrier to selectively program the IC chip to a desired address and configuration. The programmable packet permits each chip carrier to be identical. Further, the spring clips are placed in compression by the chip carrier so that the spring clips urge the chip carrier out of the base upon disassembly of the module.

17 Claims, 5 Drawing Sheets

PROGRAMMABLE INTEGRATED INPUT/OUTPUT CONNECTOR MODULE AND SPRING CLIP CONNECTOR MECHANISM

CROSS REFERENCES

The present application is one of a series of copending applications containing related technical subject matter. The related application is U.S. Ser. No. 07/559,241 filed July 30, 1990 and herein incorporated by reference.

BACKGROUND OF THE INVENTION

1. Field of the Invention

The present invention relates to a connector module having a chip carrier with mechanisms for securing the chip carrier to a molded base. More particularly, the present invention relates to a programmable connector module having a chip carrier on which an IC (integrated circuit) chip is mounted. The chip carrier is snap-fitted into a molded plastic base to interface with a multi-wire bus by means of spring contacts in the base which act as a release mechanism for removing the chip carrier. One line of the bus is ground and is connected to a programmable finger packet located between the IC chip and corresponding spring contact, thus permitting each chip carrier to be identical.

2. Description of Related Art

The prior art discloses a number of chip carrier devices and methods for the programming of chips.

U.S. Pat. No. 4,376,560 to Olsson et al discloses a socket for receiving a chip carrier which includes a plurality of elongated resilient spring contacts. The chip carrier is placed in the socket and covered by a lid whereby the spring contacts are deflected. When the lid is removed from the chip carrier, energy stored in the deflected contacts lifts the chip carrier partially from the socket to allow grasping and removal of the chip carrier.

U.S. Pat. No. 4,616,895 to Yoshizaki et al discloses an integrated circuit socket for receiving a chip carrier-type integrated circuit device. The socket includes a plurality of contacts for contacting electrodes of the IC device, each of which comprises a spring conductive member. A plurality of "pressing members" abut against the IC device when inserted in the IC socket so as to press the upper surface of the device against the upper spring force of the contacts. The spring force of the contacts and pressing members allow the IC device to be easily inserted and withdrawn.

U.S. Pat. No. 4,330,163 to Aikens et al discloses an electrical connector which allows a large scale integrated (LSI) circuit package to be inserted or removed without significant force. An LSI chip carrier is placed on a chip carrier seating ledge of the connector so that it rests upon a plurality of contact springs. The contact springs force the chip carrier upward for removal.

U.S. Pat. No. 4,358,175 to Reid discloses a connector for receiving or releasing an integrated circuit package with low force. The connector includes contact springs which are compressed by pins of the integrated circuit package when it is seated in the connector. When removing the integrated circuit package, the action of the springs on the pins allows the package to be removed.

U.S. Pat. No. 4,761,140 to Geib discloses a chip carrier receiving socket which includes several contacts which form "curved-beam-spring portions". The curved-beam-spring portions urge any contacting parts in an upward direction. The upward force of the curved-beam-spring portions assists in the removal of the chip carrier.

U.S. Pat. No. 3,771,109 to Bruckner et al discloses an electrical connector for an integrated circuit device which includes contacts comprised of spring segments. The connector includes a lid which clamps an integrated circuit device against the contacts. When the lid is released, however, the contacts force the integrated circuit device upwards for easy replacement of the device.

U.S. Pat. No. 3,393,396 to Majewski discloses an electrical connector including a base member for receiving a microcircuit, the base of which includes a plurality of spring contacts. The spring contacts provide a firm connection, while minimizing insertion and withdrawal forces.

U.S. Pat. No. 4,155,612 to Silverio discloses a programmable adapter for connecting an integrated circuit element to a socket array, such as on a circuit board. The programmable feature allows the adapter to accommodate changes in a pin array of the integrated circuit element.

U.S. Pat. No. 4,557,540 to Forbes et al discloses a program socket for an electronic device which allows substitution of a different integrated circuit device for one for which the integrated circuit was originally designed.

Although the prior art discloses programmable chips and devices for attaching chip carriers to a base, a need still exists for a single connector module which connects a chip carrier to a bus with a programmable packet located therebetween which would preclude the need for preprogramming of chips. This structure would obviate a problem in that the programmable chips of the prior art are not interchangeable. Thus, there is a need for a programming mechanism in a connector module which would allow the free interchangeability of chip carriers.

Also, there is a need for a programmable connector module which can be mechanically programmed to a desired address and configuration so as to receive and send information along a bus line, the module or modules being selectively positioned along the bus line to interact with various loads.

SUMMARY OF THE INVENTION

Accordingly, one object of this invention is to provide a novel spring contact for a connector module which would provide an electrical connection between a chip carrier and a bus and also act as a releasing mechanism for removing the chip carrier from the module for replacement.

Another object of the present invention is to provide a programmable packet electrically connected to the chip carrier and a grounded bus line which would remove the need for preprogramming of chips.

Yet another object of this invention is to allow the free interchangeability of chip carriers so chips can be easily removed and replaced.

Yet another object of the present invention is to reduce the number of wires needed in electrical-mechanical devices by providing, along a bus line, programmable modules which are located proximate to various loads.

Yet another object of the present invention is to provide a programmable connector module which is economical to manufacture and easy to assemble.

These and other objects of the present invention are achieved by a two-stage programmable connector module. The first stage of the module comprises a chip carrier on which an IC chip is fastened and electrically connected. The chip carrier is wired to accommodate various input-output operations controlled by the IC chip. The underside of the chip carrier is provided with conductive traces for interfacing the IC chip with a multi-wire bus. A second stage of the module comprises a molded plastic base which is fabricated to accommodate the chip carrier to a fitted position therein. The plastic base is provided with grooves into which are placed springs with each spring making contact with a corresponding line of the multi-wire bus. Each line of the multi-wire bus extends through the bottom interior of the molded plastic base and is secured thereto by fastening means.

The plastic base is provided with snap fasteners which are integrally connected to the base and which snap over the IC chip and lock the IC chip and chip carrier into place.

When the chip carrier is locked into place by the snap fasteners, the springs connecting to the various bus wires are placed into compression. Thus, when the snap fasteners are removed, the springs push upward upon the chip carrier and act as a release mechanism to ease removal and replacement of the chip carrier.

A programmable package having a plurality of fingers, (e.g., six) with each finger corresponding to a programmable input of the IC chip, is connected between a grounded wire of the multi-wire bus line and the IC chip. The fingers permit programming of the IC chip, so that each chip carrier is identical, with the programmable package of fingers being inserted at a harness level with an automatic wiring machine. If the fingers are not bent, each finger will come into contact with a conductive trace located on the underside of the chip carrier. Each conductive trace connects to a programmable input of the IC chip. The connection of a finger to a conductive trace grounds that input of the IC chip. If a finger is bent, then the connection to ground of the corresponding programmable input is broken and a logic 1 is programmed into that particular programmable input of the IC chip. Thus, each finger which is bent will result in a logic 1 being inputted while each finger which remains in contact with a conductive trace will result in a logic 0 being inputted.

The IC chip has a plurality of (e.g., six) programmable inputs (nodes) corresponding to the six fingers of the programmable package, with four of the inputs being programmed to designate a particular address and two of the inputs being programmed to designate a particular input-output configuration.

A plurality of such modules each programmed to a specific address and configuration can be located at various locations along the multi-wire bus line so that interaction between the various loads is facilitated. The module of the present invention is provided with means for interfacing with various loads along the multi-wire bus.

BRIEF DESCRIPTION OF THE DRAWINGS

A more complete appreciation of the invention and many of the attendant advantages thereof will be readily understood by reference to the following detailed description when considered in connection with the accompanying drawings, wherein.

DETAILED DESCRIPTION OF PREFERRED EMBODIMENTS

Figure 1:
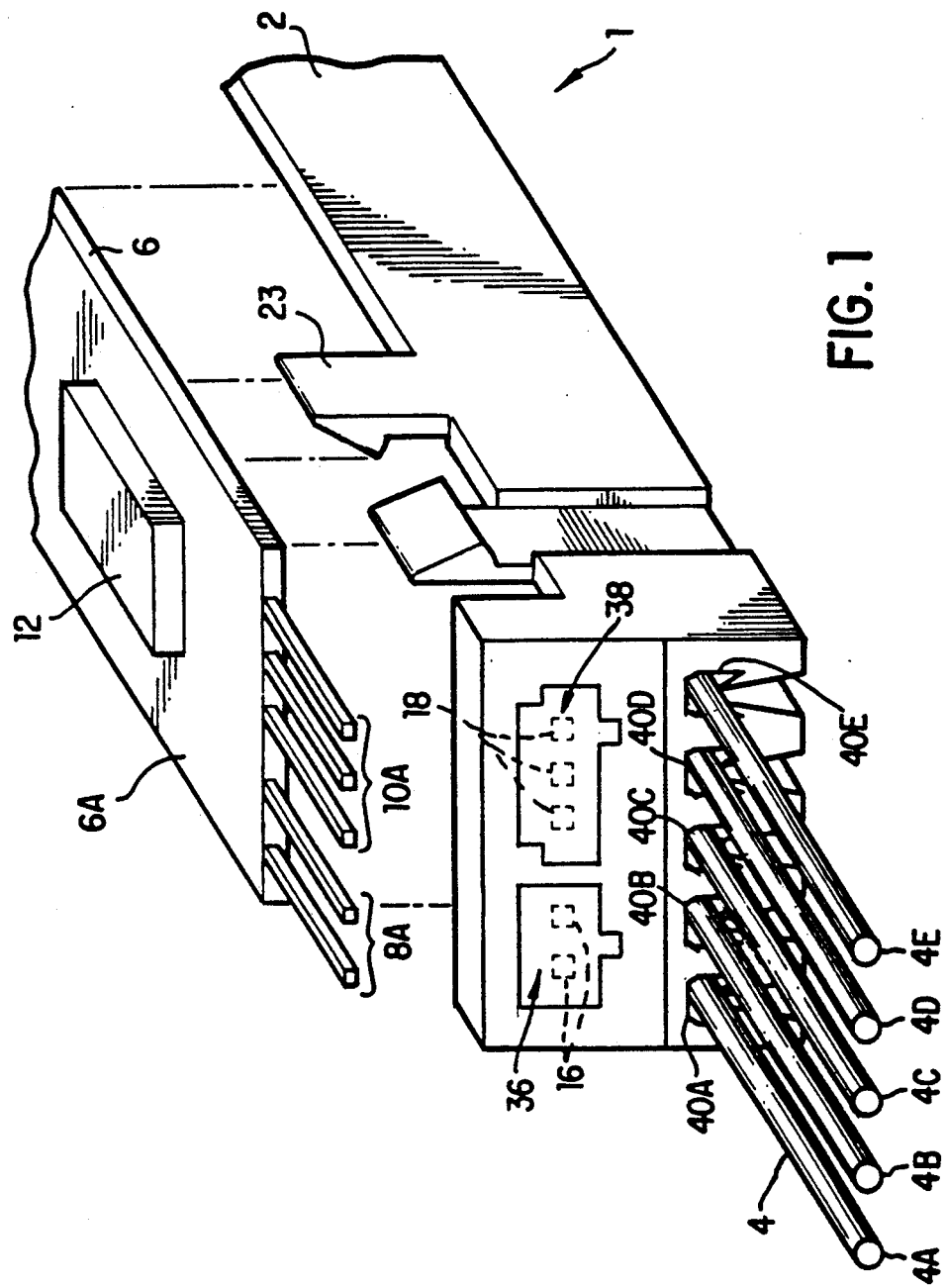
FIG. 1 is an exploded view of the molded base, chip carrier, and chip of the present invention.

FIG. 1 illustrates a two-stage module 1 in accordance with the present invention. A first stage comprises a molded base 2, and a second stage comprises a chip carrier 6 attached to molded base 2. As described below, a programmable packet 21 (FIG. 2) and a plurality of spring clips 14 electrically connects the base 2 to the chip carrier 6.

The molded plastic base 2 has a plurality of molded cavities in its bottom interior so as to allow wires 4 of a 5-wire bus to extend therethrough. The molded base 2 is preferably approximately 15 millimeters high, 40 millimeters in length, and 21.00 centimeters in width. Insulation Displacement Connectors (IDCs) 40A, 40B, 40C, 40D and 40E are provided on opposite sides of the molded base 2. The IDCs serve to direct the wires of the bus through the cavities of the molded base and further functions as a means for securing the wires of the bus (4A, 4B, 4C, 4D and 4E) to the base. The IDCs are comprised of relatively sharp metal edges spaced apart so that when the insulated bus wires are inserted into an IDC and pulled through the molded cavities of the base during the harnessing stage of assembly, the insulation is pierced allowing connection directly to the wires.

Line 4A represents a serial input data (SID) line, line 4B represents a serial output data (SOD) line, line 4C represents a grounded line, line 4D represents a voltage source line and line 4E represents a clock pulse line. Those skilled in the art will realize that the locations of the various lines 4A, 4B, 4C, 4D and 4E can be interchanged as warranted without deviating from the teachings of the invention.

Chip carrier 6 (FIG. 1) supports IC chip 12 on its top side 6A and conductive traces 15A, 15B, 15C, 15D and 15E on its underside 6B (FIG. 6) The IC chip 12 is electrically connected to each conductive trace 15 A-E and selectively connected to a grounding conductive trace 17 by the programming mechanism (programmable packet) 21 described below. Chip carrier 6 is provided with dual conductive pins 8A and 8B and triple conductive pins 10A and 10B (see FIG. 6).

Figure 4:
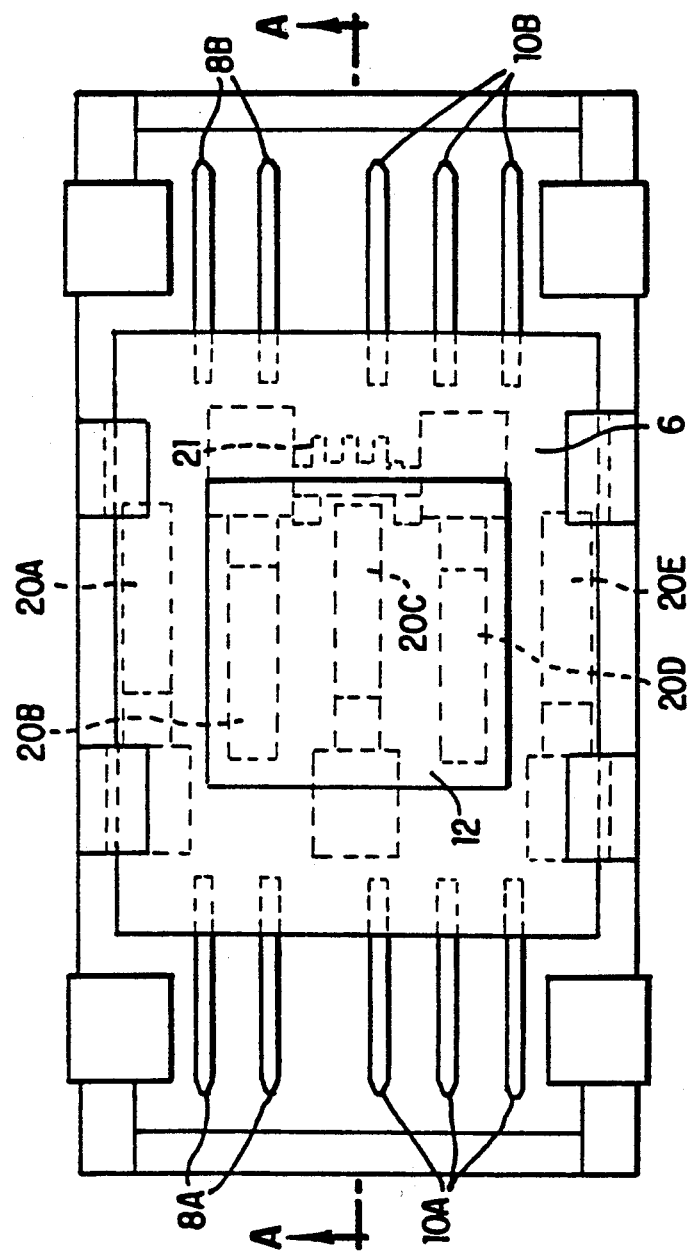
FIG. 4 is a plan view of the molded base of the present invention with the chip carrier placed therein.
Figure 7:
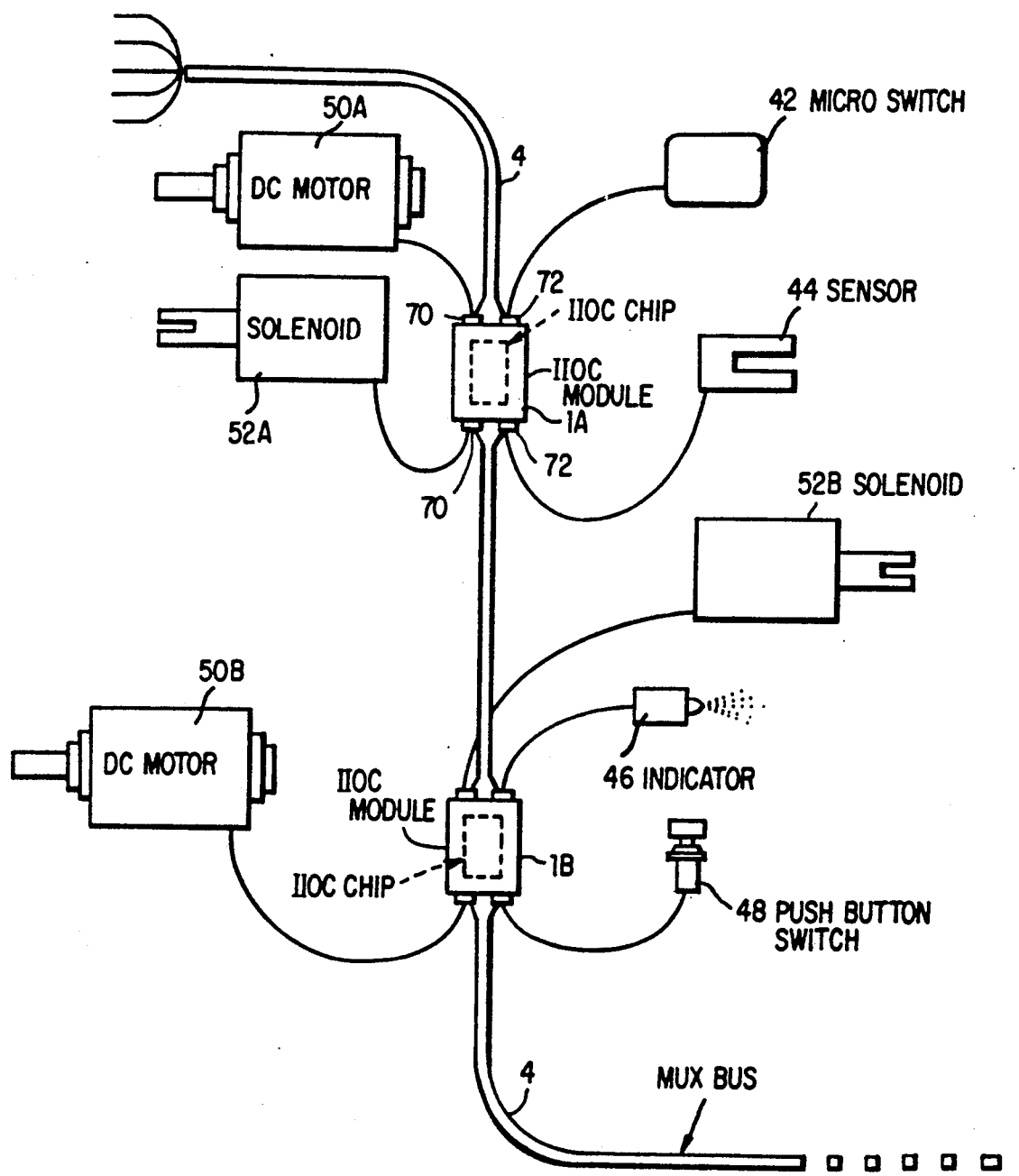
FIG. 7 illustrates the location of each module of the present invention along a bus-line with each module being proximate to various loads.

With reference to FIG. 4, chip carrier 6, dual conductive pins 8A and 8B, and triple conductive pins 10A and 10B are positioned in the molded base 2. The extreme end 16 of conductive pins 8A (see FIG. 1) are situated in dual pin interfacing socket 36. Pins 8B have a corresponding dual pin interfacing socket. The extreme end 18 of conductive pins 10A (see FIG. 1) are situated in triple pin interfacing socket 38. Pins 10B have a corresponding triple pin interfacing socket. The dual pin interfacing sockets interface with socket housing (or jack) 70 (see FIG. 7) and the triple pin interfacing sockets interface with socket housing (or jacks) 72. Triple conductive pins 10A and 10B are for connecting the module to sensors and low current, output loads such as microswitch 42, sensor 44, indicator 46 and push button switch 48 (FIG. 7). Dual conductive pins 8A and 8B are reserved for high current output such as D.C. motors 50A and 50B and solenoids 52A and 52B.

Figure 2:
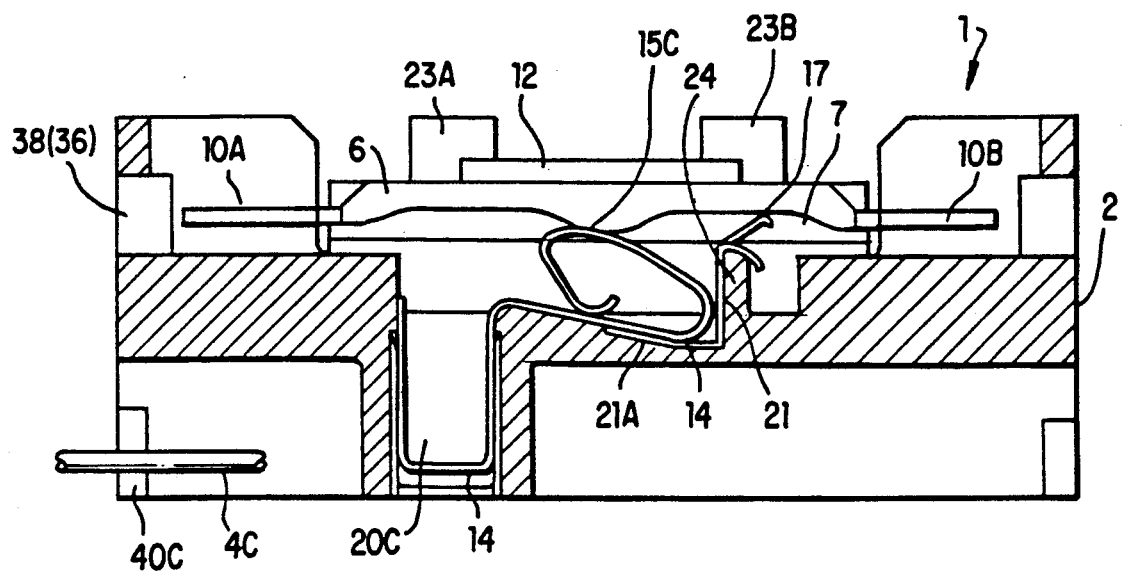
FIG. 2 is a cutaway side-view illustration (along the plane A—A of FIG. 4) of the molded base, spring clip, and programmable packet of the present invention.

Four snap fasteners 23 (only one of which is shown in FIG. 1) are integrally formed with the molded base 2 and snap fit over chip carrier 6 of the IC chip 12. FIG. 2 shows two of these snap fasteners 23A and 23B to further illustrate how the module 1 is secured together. Accordingly, snap fasteners 23 function as a means for securely snap fitting chip carrier 6 to base 2.

Molded grooves 20A, 20B, 20C, 20D and 20E (FIG. 4) in the base 2 each accommodate a spring such as spring clip 14 shown in FIG. 2 which is fitted into groove 20C. Spring clip 14 connects grounded line 4C at the bottom of the molded base to the conductive trace 15C located on the underside 6B of chip carrier 6 (see FIG. 6).

A spring clip 14 is located in each groove 20 for connecting wires 4 A-E of the bus with a corresponding conductive trace 15 A-E (i.e., a spring clip 14 is located in groove 20A for connecting line 4A with conductive trace 15A located on the underside of chip carrier 6; a spring clip 14 is located in groove 20B to connects line 4B with conductive trace 15B; a spring clip 14 is located in groove 20D to connect line 4D with conductive trace 15D; and a spring clip 14 is located in groove 20E to connect line 4E with conductive trace 15E. The clips 14 include mechanisms known to those skilled in the art (such as insulation piercing devices) for electrically connecting the clips 14 to the wires 4.

Figure 5:
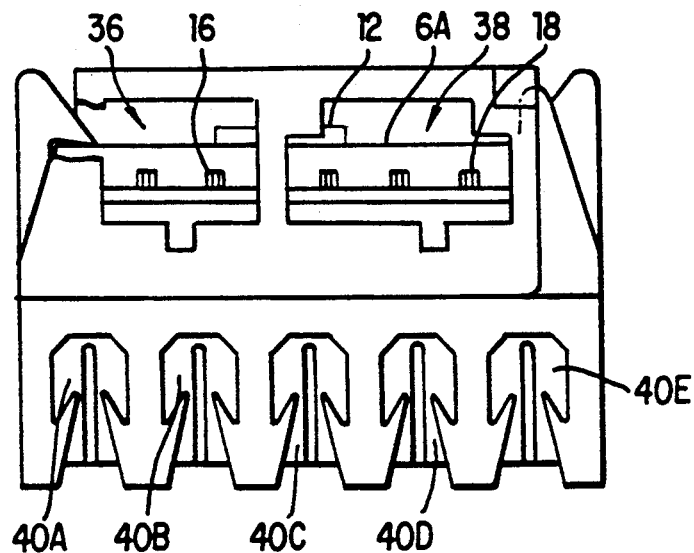
FIG. 5 illustrates the positioning of the two-prong and three-prong connectors of the chip carrier in the molded base.

When the module is snapped together each spring clip 14, is compressed so as to make secure contact with its corresponding conductive trace such as trace 15C (FIG. 5) located on the underside 6B of chip carrier 6. Since the spring clips are placed in compression when the module is fastened together by the snap fasteners 23, the spring clips will act as a release mechanism for the chip carrier 6 when the snap connection between the snap fasteners 23 and chip carrier 6 is removed. The spring clips 14 thus facilitate electrical connection between the conductive traces 15 and wire 4 A-E, and also removal of the IC chip carrier 6 upon disassembly of the module.

Accordingly, dual conductive pins 8A and 8B, and triple conductive pins 10A and 10B function as first electrical connections for electrically attaching input and/or output devices (e.g., devices 42, 44, 46, 48, 50A, 50B, 52A, 52B which are located externally of module 1) to chip carrier 6, and thus to chip 12. Conductive traces 15 A-15E function as second electrical connections for electrically connecting the bus wires 4 A-E to chip carrier 6 (and thus to IC chip 12) via spring clips 14. Spring clips 14 function as means for electrically connecting base 2 to the multi-wire bus, and also as electrical contact means for making electrical contact with the second connections (conductive traces 15A-15E) of the chip carrier 6.

Figure 3:
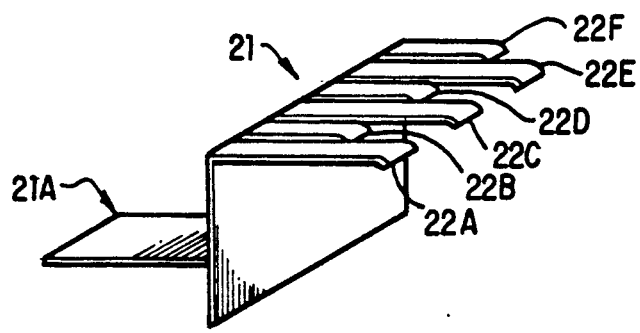
FIG. 3 is a perspective view of the programmable packet according to the present invention.
Figure 6:
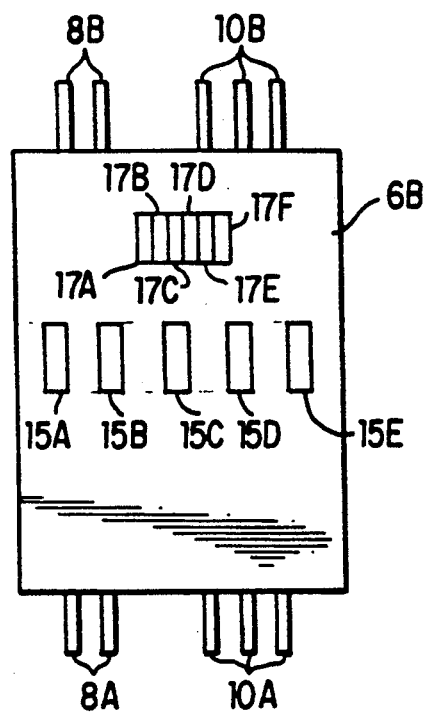
FIG. 6 illustrates the conductive traces on the underside of the chip carrier.

Positioned on a central ridge 24 of the groove 20C for the spring 14 connecting to the ground wire 4C (as shown in FIG. 2) is a programmable finger packet 21 having six programmable fingers 22A, 22B, 22C, 22D, 22E and 22F as shown in FIG. 3. One end 21A of the packet 21 contacts the spring 14 in the groove 20C to electrically connect the packet 21 to the ground wire 4C. Each of the fingers 22 A-F can be selectively connected to the grounding conductive trace 17 to selectively ground a corresponding one of six programmable inputs (nodes) on the chip 12. With reference to FIG. 6, finger 22A can be selectively connected to trace 17A, finger 22B to trace 17B, finger 22C to trace 17C, finger 22D to trace 17D, finger 22E to trace 17E and finger 22F to trace 17F.

The finger packet 21 shown in FIG. 2 lies on ridge 24 in cavity area 7 of the module and is seen to have some of its fingers 22 A-F making contact with the grounding conductive trace 17 on the lower surface 6B of chip carrier 6 and some not making contact therewith. Each finger 22 A-F which makes contact with the conductive trace 17 (FIG. 5) on the undersurface 6B of the chip carrier 6 will result in a logic 0 being programmed into the corresponding programmable input of IC chip 12 since the input is grounded. However, if a finger 22 A-F is bent so as not to contact conductive trace 17, a logic 1 will be inputted to the chip 12 since the connection to ground is broken.

The six programmable fingers (22A, 22B, 22C, 22D, 22E and 22F) of finger packet 21 can be utilized to designate a particular address and input-output configuration for a particular module. Four of the fingers are used to designate a particular address; thus in binary fashion, 16 addresses are possible (from address 0 to 15). The remaining two fingers are used to designate the input-output configuration of the module. Thus, it is seen how traces 17 A-F function as programmable inputs to the chip carrier 6 and to the IC chip 12, and how programmable packet 21 functions as means for programming IC-chip 12.

The use of the programmable finger packet 21 permits each chip carrier 6 to be identical, thus facilitating their replacement in the field (the replacement also being eased by the compression of the spring clips 14 urging the chip carrier 6 away from the base 2). The programming of the finger packet 21 is done at the harness level (i.e., when connecting the bus wire to the input/output devices) with an automatic wiring machine. Once programmed, any chip carrier 6 can be substituted into the base 2.

Being thus programmed, chip 12 of the module can receive signals from the five wire bus and convert the signals into states for the output devices while sending back on the bus the state of the input devices. By being programmed to a particular configuration, the chip can control which loads are to receive signals and which loads are to have signals sent back along the bus line.

FIG. 7 serves to illustrate how each module located along a bus line can be programmed to receive information intended for that particular address and to interact with the adjacent loads according to a particular configuration. For example, module 1A may be programmed to send information to D.C. motor 50A, solenoid 52A and microswitch 42; while receiving information from sensor 44 which information is then outputted along the bus. Module 1B can be programmed to send information to DC motor 50B, solenoid 52B and indicator 46 while receiving information from switch 48.

The foregoing description is intended to be illustrative and not limiting. Numerous changes and modifications to the invention described herein will be apparent to those skilled in the art. However, any such changes and modifications are intended to be within the scope of the invention as defined in the following claims.

What is claimed is:

1. A programmable input/output connector module for connecting at least one of an input device and an output device to a multi-wire bus, said bus carrying signals for controlling input and output devices, the module comprising:
   a first stage having means for electrically connecting said first stage directly to the multi-wire bus:
   a second stage supported on the first stage and having an IC chip mounted thereon, said second stage including first electrical connections for connecting the input and output devices to the IC chip and second electrical connections for connecting said multi-wire bus to the IC chip for conveying said signals between said multi-wire bus and said input and output devices; and
   programming means for programming the IC chip so that the first electrical connections and the second electrical connections are selectively connected to each other through the IC chip.

2. A module according to claim 1, wherein said second stage comprises a chip carrier on which the IC chip is mounted and to which said IC chip is electrically connected.

3. A module according to claim 2 wherein:
   said first stage is a base formed to accommodate said chip carrier.

4. A module according to claim 3, wherein the means for electrically connecting the first stage to the multi-wire bus includes:
   a plurality of spring clips for electrically connecting the second electrical connections with the multi-wire bus, each spring clip of said plurality of spring clips being located in a corresponding channeled groove located in said base to electrically connect a corresponding second electrical connection of the chip carrier to a corresponding wire of the multi-wire bus.

5. A module according to claim 4, wherein the base comprises means for securely snap fitting said chip carrier to said base.

6. A module according to claim 5, wherein:
   said means for securely snap fitting urges said chip carrier against said spring clips to place said spring clips in compression.

7. A module according to claim 6, wherein the second electrical connections of the chip carrier include a plurality of conductive traces on said chip carrier for making electrical contact with said plurality of spring clips.

8. A module according to claim 1, wherein said programming means comprises a programmable packet having a plurality of fingers with each finger of said plurality of fingers corresponding to and being connectable to a programmable input of said IC chip.

9. A module according to claim 8, wherein each finger of the programmable packet is selectively electrically connectable to the programmable input of said IC chip.

10. A module according to claim 9, wherein:
    each finger of said programmable packet is deformable to one of a non-contacting state and a contacting state, said finger being deformed into the non-contact state to avoid contact with said programmable input of said IC chip to program a first logic into the programmable input of said IC chip, and said finger remaining in contact with said programmable input of the IC chip in the contact state to program the programmable input of said IC chip to a second logic.

11. A module according to claim 1, wherein the programming means programs said IC chip for a specific address and a specific input/output configuration.

12. A module according to claim 3, further comprising means for securing said multi-wire bus to said base, said means for securing comprising means for piercing insulation of the wires of said multi-wire bus.

13. A programmable input/output connector module comprising:
    a chip carrier having programmable inputs connectable to an IC chip and first and second electrical connections for placing external devices in electrical communication with the IC chip;
    a base for supporting the chip carrier, said base having a plurality of hollow grooves;
    electrical contact means, located within said plurality of hollow grooves in the base, for making electrical contact with the second electrical connections of said chip carrier; and
    means, located between the programmable inputs of said chip carrier and the electrical contact means in the base, for programming said programmable inputs of said chip carrier to designate an address and an input/output configuration between said first and second electrical connections.

14. A module according to claim 13, further comprising:
    a multi-wire bus connected to and extending through said base with one wire of said bus being ground.

15. A module according to claim 14, wherein:
    said electrical contact means comprises a plurality of spring clips which are compressible between the chip carrier and the base, one of said spring clips being grounded by connection to the grounded line of said bus.

16. A module according to claim 15, wherein:
    said means for programming comprises a programmable packet having a plurality of fingers corresponding in number to the programmable inputs of the chip carrier, said means for programming being connected to said grounded spring clip.

17. A module according to claim 14, wherein said base comprises means for securing the lines of said multi-wire bus, said means for securing comprising means for stripping the lines of said multi-wire bus of insulation.

* * * * *